United States Patent
Armacost et al.

(10) Patent No.: US 6,228,279 B1
(45) Date of Patent: May 8, 2001

(54) HIGH-DENSITY PLASMA, ORGANIC ANTI-REFLECTIVE COATING ETCH SYSTEM COMPATIBLE WITH SENSITIVE PHOTORESIST MATERIALS

(75) Inventors: Michael Armacost, Wallkill; Peter Hoh, Hopewell Junction; Richard S. Wise, Beacon; Wendy Yan, Somers, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/156,065

(22) Filed: Sep. 17, 1998

(51) Int. Cl.$^7$ ................................................ H01L 21/3065
(52) U.S. Cl. ..................... 216/67; 216/47; 216/49; 216/72; 430/273.1; 714/725; 714/733; 714/738; 714/952
(58) Field of Search ........................ 438/714, 725, 438/733, 738, 952; 216/47, 67, 72, 49; 430/5, 961, 273.1; 252/79.1

(56) References Cited

U.S. PATENT DOCUMENTS

| | | | |
|---|---|---|---|
| 3,940,506 | * | 2/1976 | Heinecke .......................... 427/38 |
| 5,269,879 | * | 12/1993 | Rhoades et al. ..................... 156/643 |
| 5,284,922 | * | 2/1994 | Amano et al. ..................... 525/328.2 |
| 5,308,742 | | 5/1994 | Ta .......................................... 430/313 |
| 5,443,941 | | 8/1995 | Bariya et al. ........................ 430/313 |
| 5,508,133 | * | 4/1996 | Bae ........................................... 430/5 |
| 5,516,886 | * | 5/1996 | Rahman et al. ...................... 528/482 |
| 5,543,265 | * | 8/1996 | Garza ................................. 430/270.1 |
| 5,721,090 | | 2/1998 | Okamoto et al. .................... 430/313 |
| 5,767,019 | * | 6/1998 | Armacost et al. ................... 438/694 |
| 5,830,624 | * | 11/1998 | Bae et al. ............................. 430/323 |
| 5,843,845 | * | 12/1998 | Chung ................................. 438/713 |
| 5,910,453 | * | 6/1999 | Gupta et al. ........................... 216/47 |
| 5,920,796 | * | 7/1999 | Wang et al. ......................... 438/700 |
| 5,948,598 | * | 9/1999 | Shieh et al. .......................... 430/311 |
| 5,976,395 | * | 11/1999 | Ha ....................................... 216/67 |
| 6,068,784 | * | 5/2000 | Collins et al. ........................ 216/68 |
| 6,133,153 | * | 10/2000 | Marquez et al. .................... 438/706 |

FOREIGN PATENT DOCUMENTS

777267 A1  *  6/1997 (EP).
805485 A2  *  11/1997 (EP).
908940 A2  *  4/1999 (EP).

* cited by examiner

Primary Examiner—Anita Alanko
(74) Attorney, Agent, or Firm—Ratner & Prestia; Steven Capella, Esq.

(57) ABSTRACT

By providing a photoresist material with a protective polymer layer during the etching of an organic anti-reflective coating, undue damage to the photoresist material can be avoided during opening of the anti-reflective coating without the need for an oxidant. The preferred polymer chemistry system for producing such a result includes a fluorohydrocarbon-containing polymer mixture with a strong source of $CF_3$, preferably $C_2F_6$. The etchant also includes a source of hydrogen selected from $CH_3F$, $C_2HF_5$, or $CH_2F_2$, and a diluent selected from Ar, He or $N_2$.

10 Claims, 2 Drawing Sheets

(PRIOR ART)

HIGH-DENSITY PLASMA, ORGANIC ANTI-REFLECTIVE COATING ETCH SYSTEM COMPATIBLE WITH SENSITIVE PHOTORESIST MATERIALS

TECHNICAL FIELD

The present invention is generally directed to lithographic processes and, more particularly, to an etching process that is particularly well suited to the removal of organic coatings used in the lithographic process.

BACKGROUND OF THE INVENTION

To meet the demands of the industry, it has generally become desirable to manufacture semiconductor devices having features that are continually decreasing in size. This requirement has led to the development of lithographic processes, capable of increased accuracy, to produce such features. In practice, however, such processes have been found to be correspondingly difficult to implement.

For example, the implementation of lithographic techniques such as 248-nm lithography have permitted the manufacture of features of a size sufficiently small to meet many practical demands. The extension of 248-nm lithography to such applications has in many cases necessitated the introduction of correspondingly more sensitive photoresist materials, however, such as the "deep ultraviolet" (DUV) photoresists. Such photoresist materials have tended to demonstrate poor performance with traditional etching processes, exhibiting a significant potential for damage. This potential for damage to the photoresist has typically been addressed by the application of less aggressive etching processes (i.e., using lower power, less reactant flow, etc.). Such measures lead, in turn, to a loss of etch rate, and possibly a reduction in anisotropy.

It has been found that, in many cases, a "high density plasma" (HDP) process can be used to improve throughput and to better control critical dimension (CD). High-density plasma sources typically offer a much higher etch rate than traditional, diode-type reactors. This higher rate results because the plasma electrons are excited in a direction normal to the reactor boundaries, which allows the operating pressure to be reduced to a point where the electron mean free path is much larger than the physical size of the reactor. In order to be self-sustaining, the plasma attains a higher electron and reactive neutral density, to compensate for greater diffusion losses.

It has further been found, however, that the accuracy of a lithographic process can be improved using an "organic anti-reflective coating" (ARC) to improve the apparent flatness of the reflective surfaces established in the photoresist materials. Although they facilitate the development of more precise (and smaller) features, such anti-reflective coatings tend to have etching characteristics similar to the photoresist materials with which they are used. This similarity makes it difficult to avoid damage to the photoresist material while at the same time ensuring that the anti-reflective coating is effectively opened.

As a result, when applied to ARC etching applications, high density plasma etching processes (or "tools") have been found to suffer from poor DUV photoresist protection due to their aggressiveness (i.e., high ion flux, high dissociation fraction, etc.). This drawback has tended to complicate the implementation of desirable characteristics (features) using such high-density plasma sources. For this reason, ARC openings for sensitive photoresist materials have generally been formed using a traditional process tool to minimize the potential for damage, presumably by limiting the etch rate and the reactant flow. Much of the throughput advantage of a high-density plasma tool is lost, however, when a conventional tool must be used to open the ARC layer.

Previous state-of-the-art tools using high-density plasma to open an anti-reflective coating have relied on the addition of oxidants to combust the organic material. For example, mixtures of He and $O_2$ using very low power levels (e.g., a 150 Watt bias or less) have shown promise for less sensitive photoresist materials, such as polyhydroxystyrene resists having protecting groups pendant from some of the styrene groups. Similarly, mixtures of Ar and $CO_2$, using low bias powers, have also performed adequately on such materials. Both of these mixtures have shown unsatisfactory microfissures, however, on the more sensitive photoresist materials, such as resists containing a combination of hydroxystyrene and protecting acrylate monomers in the same polymer chain, as is shown in FIG. 1. In addition, with more sensitive photoresist materials, the photoresist can be laterally attacked by oxidants, leading to a loss of critical dimension (CD) control, as is shown in FIG. 2.

One approach to decrease both microfissures and CD growth is to include a polymerizing agent in the ARC etch. The deposition of the polymer requires an ion sputtering component for the etching to proceed, which increases the anisotropy of the etch process. In addition, the deposited polymer can reduce the degree of microfissures due to selective deposition.

As an example, the effect of adding a polymer to an oxidant-based ARC etch is shown in FIG. 3. It has been found that, in practice, the bias power must be increased to overcome the polymer deposition. Once again, while the resulting performance is satisfactory on less sensitive photoresist materials, damage still tends to occur for the more sensitive photoresist materials.

Therefore, a primary object of the present invention is to provide an improved etching system for opening an organic anti-reflective coating. Another object of the present invention is to provide an improved etching system for opening an organic anti-reflective coating using a high-density plasma source. Still another object of the present invention is to provide an improved etching system for opening an organic anti-reflective coating, using a high-density plasma source, while minimizing damage to the photoresist material.

SUMMARY OF THE INVENTION

These and other objects which will become apparent are achieved in accordance with the present invention by providing an etching system having a chemistry which provides a protective polymer layer on the photoresist material during the etching of an organic anti-reflective coating. The protective polymer layer allows the system to avoid undue damage to the photoresist material during the ARC opening process. With an appropriate polymer chemistry, it has been found that the need for an oxidant can be completely eliminated, and ARC etching can proceed as desired.

To this end, a fluorohydrocarbon-containing mixture is introduced into the etching system, preferably a mixture which includes a strong source of $CF_3$ (i.e., a source which easily dissociates to provide $CF_3$ in the etching environment). This mixture forms polymer in-situ in the etching environment. In this way, attack of the photoresist material is minimized, even at the elevated biasing power levels that are sufficiently high for ARC etching to proceed. The effective fluorine (F) content of the system is preferably made tunable by the in-situ polymer and the hydrogen (H)

content. It is generally preferable to add a diluent, such as argon (Ar) or helium (He) to the system to decrease the residence time of potentially harmful etch products, as well as to allow more efficient sputtering of the polymer from the operative surface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF PREFERRED EMBODIMENTS

In accordance with the present invention, it has been found that the etching of an anti-reflective coating can proceed, without requiring the use of an oxidant, by appropriately selecting the (in-situ) polymer chemistry for the etching process that is used. Specifically, by introducing a fluorohydrocarbon-containing mixture to the system, which mixture has a strong source of $CF_3$, attack of the photoresist material is minimized. This effect results even at the elevated bias power levels that must be maintained for ARC etching to proceed in the absence of an oxidant.

The fluorohydrocarbon provides hydrogen to the etch mixture. Additionally, the fluorohydrocarbon affects the amount and nature of in-situ polymer formed. The fluorohydrocarbon is preferably selected from the group consisting of $CH_3F$, $C_2HF_5$ and $CH_2F_2$, with $CH_3F$ being most preferred.

The source of $CF_3$ is preferably one which easily dissociates in the etching environment to produce this compound. $C_2F_6$ is the most preferred source since it forms $CF_3$ with little other byproduct constituents. The relative amount of $CF_3$ source predominantly affects the effective amount of fluorine available for etching.

The fluorine content for the system is tunable by the amount and nature of in-situ polymer and the hydrogen content (e.g., by controlling the ratio of fluorohydrocarbon and $CF_3$ source). A diluent such as argon or helium is preferably added to the system to decrease the residence time of any potentially harmful etch products, as well as to allow more efficient sputtering of the polymer from the surface.

Preferred mixtures of gases for implementing an ARC opening system in accordance with the present invention will contain from 50 vol. % to 99 vol. % $C_2F_6$, from 1 vol. % to 40 vol. % $CH_3F$, and from 0 vol. % to 49 vol. % argon, the volume percentages being based on the overall gas mixture. As noted above, the $C_2F_6$ content will dissociate to provide the strong source of $CF_3$ that is desired. Alternative diluents such as helium or nitrogen ($N_2$), as well as alternative hydrogen sources such as $C_2HF_5$ or $CH_2F_2$, can also be used to yield a similar level of performance.

The selected mixture of gases is preferably introduced into an inductively coupled plasma chamber, which preferably uses a bias power of from 200 to 1,200 W and a source power of from 1,200 to 2,500 W. The operating pressure for the system is preferably kept between 5 mT and 20 mT to maximize resist selectivity and anisotropy. The process has been demonstrated using an Applied Materials HDP tool, and is extendible to any tool that uses inductive plasma generation.

It should be understood that the invention is not limited to the etching of any specific organic ARC layer composition.

EXAMPLE

Figure 1:
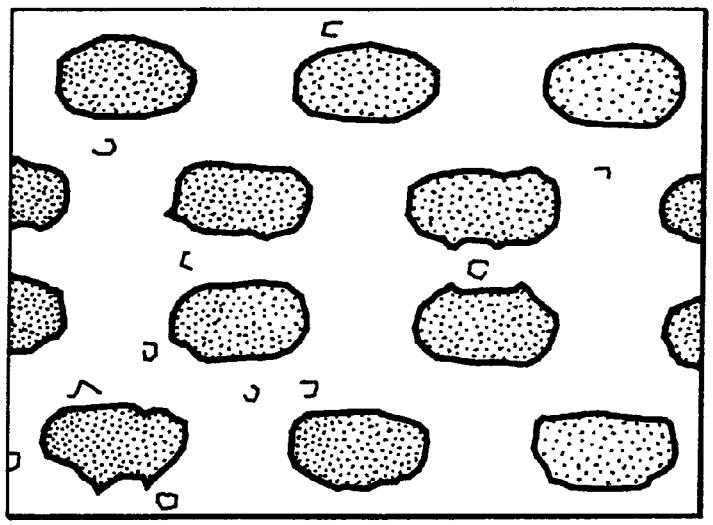
FIG. 1 is a photomicrograph showing the presence of microfissures on a prior art photoresist material.
Figure 2:
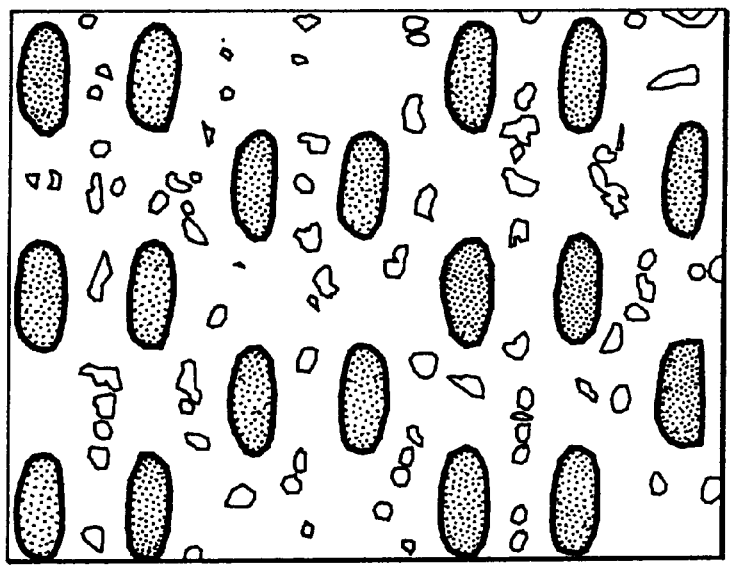
FIG. 2 is a photomicrograph showing the lateral attack of a prior art photoresist material by an oxidant.
Figure 3:
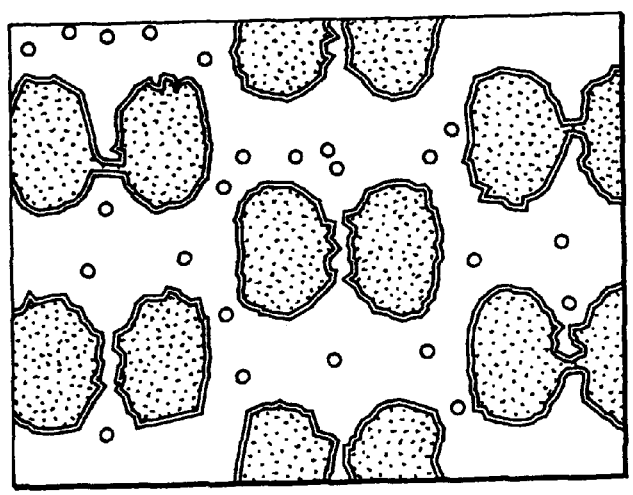
FIG. 3 is a photomicrograph showing the effects of adding a polymer to a prior art oxidant-based ARC etch.
Figure 4:
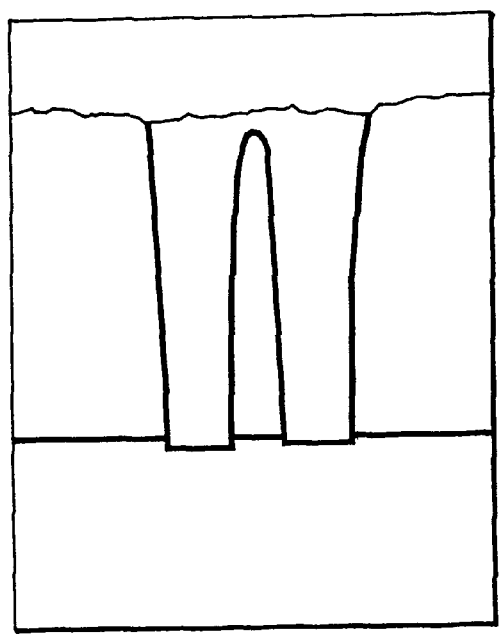
FIG. 4 is a photomicrograph showing the opening of an organic anti-reflective coating using the polymer chemistry system of the present invention.

As an example, FIG. 4 shows the result of an organic ARC etching process to form an "open" using a $C_2F_6/CH_3F/Ar$ mixture comprised of about 57 vol. % $C_2F_6$, 11 vol. % $CH_3F$, and 32 vol. % Ar. The photoresist used to define the area to be opened was a commercially available deep UV resist containing a combination of hydroxystyrene and protecting acrylate monomers in the same polymer chain. In this example, the system was operated at a pressure of about 5 mT and the bias/source power ratio was kept high (i.e., 600 W/1,500 W) to ensure that the ARC layer was opened even in the absence of an oxidant. As is seen from FIG. 4, there was minimal damage to the oxide surface following opening of the ARC layer and the oxide etch. The CD growth was not measurable by scanning electron microscopy (SEM).

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for etching an organic antireflective coating formed on a photoresist material using a high-density plasma source, comprising the steps of:

introducing a fluorohydrocarbon-containing mixture into a reaction chamber, wherein the mixture includes $C_2F_6$, a source of hydrogen selected from the group consisting of $CH_3F$, $C_2HF_5$, and $CH_2F_2$, and a diluent selected from the group consisting of Ar, He, and $N_2$; and applying the high-density plasma source to the reaction chamber containing the mixture, to etch the antireflective coating with a strong source of $CF_3$ produced from the mixture.

2. The method of claim 1 wherein the etching proceeds without an oxidant.

3. The method of claim 1 wherein the mixture includes $C_2F_6$, $CH_3F$, and Ar.

4. The method of claim 3 wherein the mixture includes from about 50 to 99 vol. % $C_2F_6$, from about 1 to 40 vol. % $CH_3F$, and from about 0 to 49 vol. % Ar.

5. The method of claim 1 wherein the mixture includes about 57% $C_2F_6$, 11% $CH_3F$, and 32% Ar.

6. The method of claim 1 which further includes the step of operating the reaction chamber at a bias power of from 200 to 1,200 W.

7. The method of claim 6 which further includes the step of operating the reaction chamber at a source power of from 1,200 to 2,500 W.

8. The method of claim 7 wherein the reaction chamber is operated at a bias/source power ratio of 600 W/1,500 W.

9. The method of claim 1 which further includes the step of operating the reaction chamber at a pressure of from 5 mT to 20 mT.

10. The method of claim 9 wherein the operating pressure is about 5 mT.

* * * * *

UNITED STATES PATENT AND TRADEMARK OFFICE
CERTIFICATE OF CORRECTION

PATENT NO. : 6,228,279 B1
DATED : May 8, 2001
INVENTOR(S) : Armacost et al.

It is certified that error appears in the above-identified patent and that said Letters Patent is hereby corrected as shown below:

<u>Column 4,</u>
Claim 5, delete "1" insert -- 4 --.

Signed and Sealed this

Nineteenth Day of February, 2002

Attest:

*Attesting Officer*

JAMES E. ROGAN
*Director of the United States Patent and Trademark Office*